US010820440B2

(12) United States Patent
Goergen et al.

(10) Patent No.: US 10,820,440 B2
(45) Date of Patent: Oct. 27, 2020

(54) MINIMAL TOUCH BRACKET FOR CABLE ROUTING WITH RACK MOUNTED DEVICES

(71) Applicant: Cisco Technology, Inc., San Jose, CA (US)

(72) Inventors: Joel Richard Goergen, Soulsbyville, CA (US); Rohit Dev Gupta, Karnataka (IN); Prashanth Pavithran, Karnataka (IN); Manigandan Boopalan, Karnataka (IN); Luca Della Chiesa, Concorezzo (IT)

(73) Assignee: CISCO TECHNOLOGY, INC., San Jose, CA (US)

( * ) Notice: Subject to any disclaimer, the term of this patent is extended or adjusted under 35 U.S.C. 154(b) by 59 days.

(21) Appl. No.: 15/487,148

(22) Filed: Apr. 13, 2017

(65) Prior Publication Data
US 2018/0252335 A1    Sep. 6, 2018

Related U.S. Application Data

(60) Provisional application No. 62/465,879, filed on Mar. 2, 2017.

(51) Int. Cl.
*H05K 7/02* (2006.01)
*H04Q 1/02* (2006.01)
*H02G 3/04* (2006.01)
*H04Q 1/06* (2006.01)

(52) U.S. Cl.
CPC ............. *H05K 7/02* (2013.01); *H02G 3/045* (2013.01); *H04Q 1/06* (2013.01); *H04Q 1/09* (2013.01)

(58) Field of Classification Search
CPC .......... F16L 3/015; F16L 3/26; H02G 3/0456; H05K 7/02; H05K 7/1491; H05K 7/1489; H05K 7/14
See application file for complete search history.

(56) References Cited

U.S. PATENT DOCUMENTS

| 4,018,982 A * | 4/1977 | Svekis | F24H 3/002 174/663 |
| 4,430,521 A * | 2/1984 | Ofield | F24H 9/1863 174/663 |
| 5,921,402 A * | 7/1999 | Magenheimer | H02G 3/26 211/26 |
| 6,215,069 B1 * | 4/2001 | Martin | H02G 3/0456 174/68.3 |

(Continued)

OTHER PUBLICATIONS

International Search Report and Written Opinion from the International Searching Authority, dated May 30, 2018, 11 pages, for corresponding International Patent Application No. PCT/US2018/019361.

*Primary Examiner* — Anita M King
(74) *Attorney, Agent, or Firm* — Polsinelli PC

(57) ABSTRACT

The present technology provides minimal touch cable guides for rack-mounted devices. The minimal touch cable guides disclosed herein provide structures for routing cables from field replaceable units installed in a rack mounted device in such a way that cables of different types are not crossed and provides a mechanism for adjusting installed cabling to permit access to otherwise obscured field replaceable units. Such adjustment of cabling is provided in a controlled manner that does not impair the performance the installed cabling.

20 Claims, 19 Drawing Sheets

(56) References Cited

U.S. PATENT DOCUMENTS

| | | | | |
|---|---|---|---|---|
| 6,398,149 B1 * | 6/2002 | Hines | ............... | A47B 21/06 |
| | | | | 242/388.6 |
| 6,501,899 B1 * | 12/2002 | Marrs | ............... | G02B 6/4452 |
| | | | | 385/134 |
| 6,590,785 B1 * | 7/2003 | Lima | ............... | H04Q 1/06 |
| | | | | 174/69 |
| 6,600,107 B1 * | 7/2003 | Wright | ............... | H02B 1/202 |
| | | | | 174/101 |
| 7,022,916 B1 * | 4/2006 | Cavanaugh | ............... | H05K 7/1491 |
| | | | | 174/100 |
| 7,077,688 B2 * | 7/2006 | Peng | ............... | H02G 3/32 |
| | | | | 248/68.1 |
| 7,748,541 B2 * | 7/2010 | Smith | ............... | G02B 6/4452 |
| | | | | 211/26.2 |
| 7,753,319 B1 * | 7/2010 | Updegrove | ............... | H02G 3/30 |
| | | | | 248/558 |
| 8,003,890 B2 * | 8/2011 | Donowho | ............... | H02G 3/0456 |
| | | | | 174/100 |
| 9,144,174 B2 * | 9/2015 | Chen | ............... | H05K 7/1421 |
| 9,161,100 B2 * | 10/2015 | Chang | ............... | H04Q 1/06 |
| 9,556,972 B2 * | 1/2017 | White | ............... | H02G 3/32 |
| 9,634,472 B2 * | 4/2017 | Kaml | ............... | F16M 13/022 |
| 9,966,695 B2 * | 5/2018 | Fernandez | ............... | H01R 13/5804 |
| 2005/0135767 A1 | 6/2005 | Diaz et al. | | |
| 2006/0171651 A1 * | 8/2006 | Laursen | ............... | H04Q 1/064 |
| | | | | 385/135 |
| 2007/0104449 A1 | 5/2007 | Thom | | |

* cited by examiner

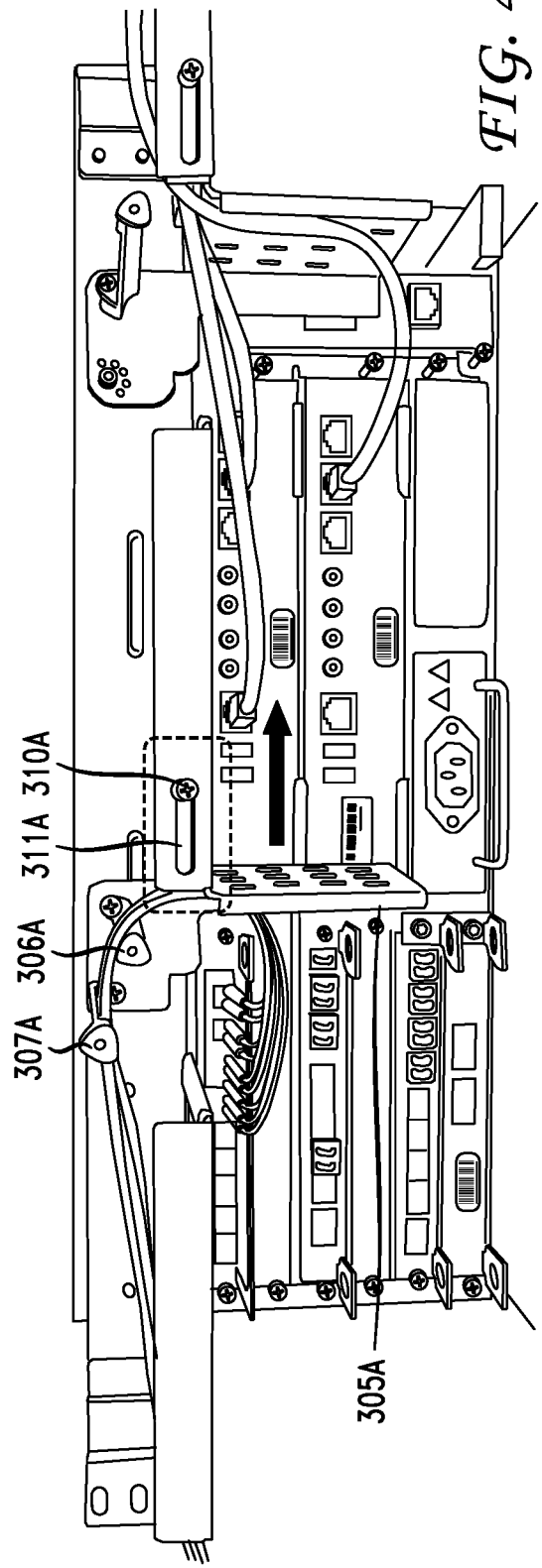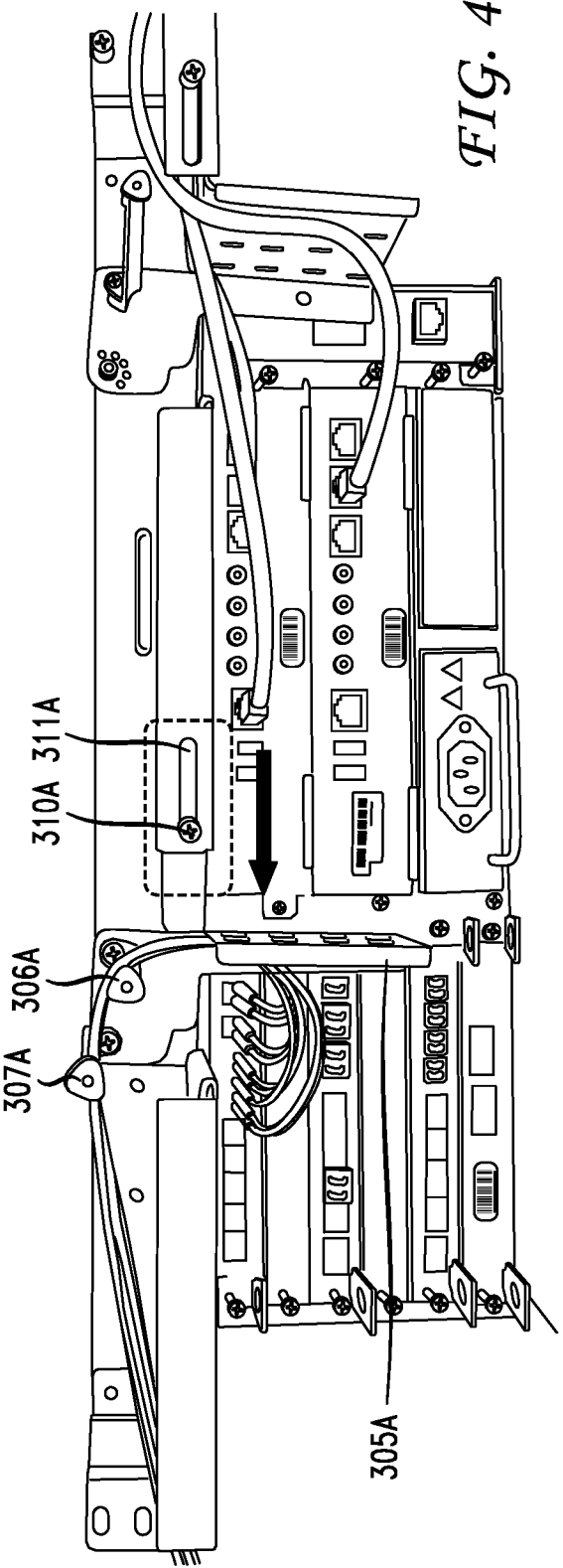

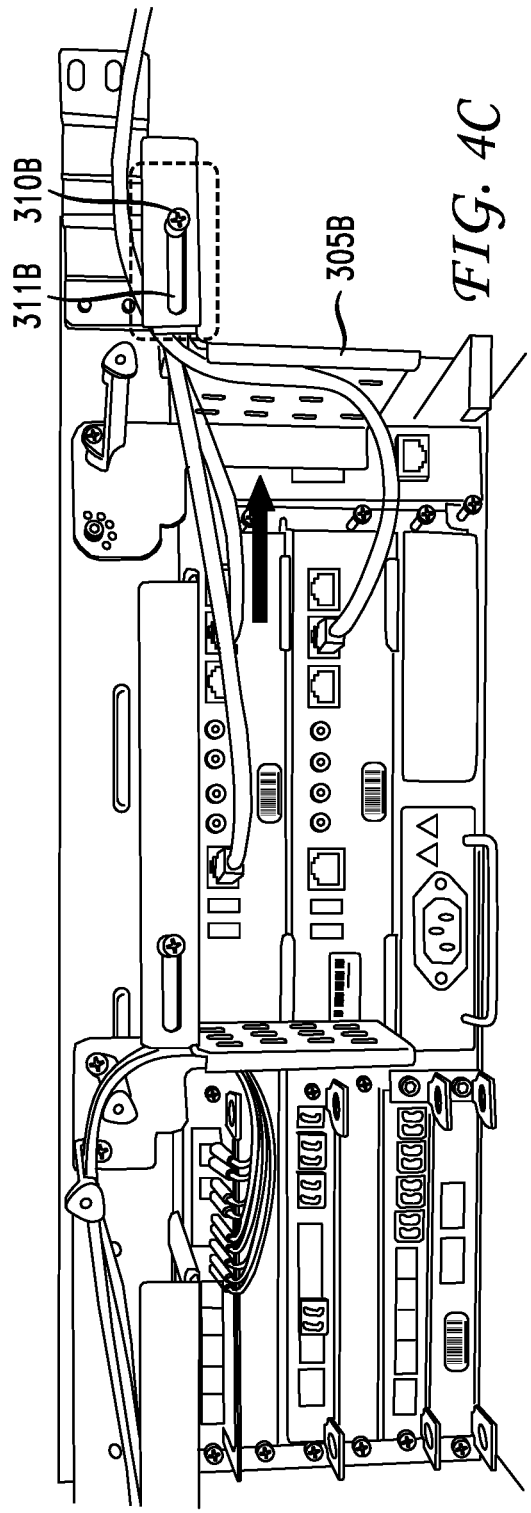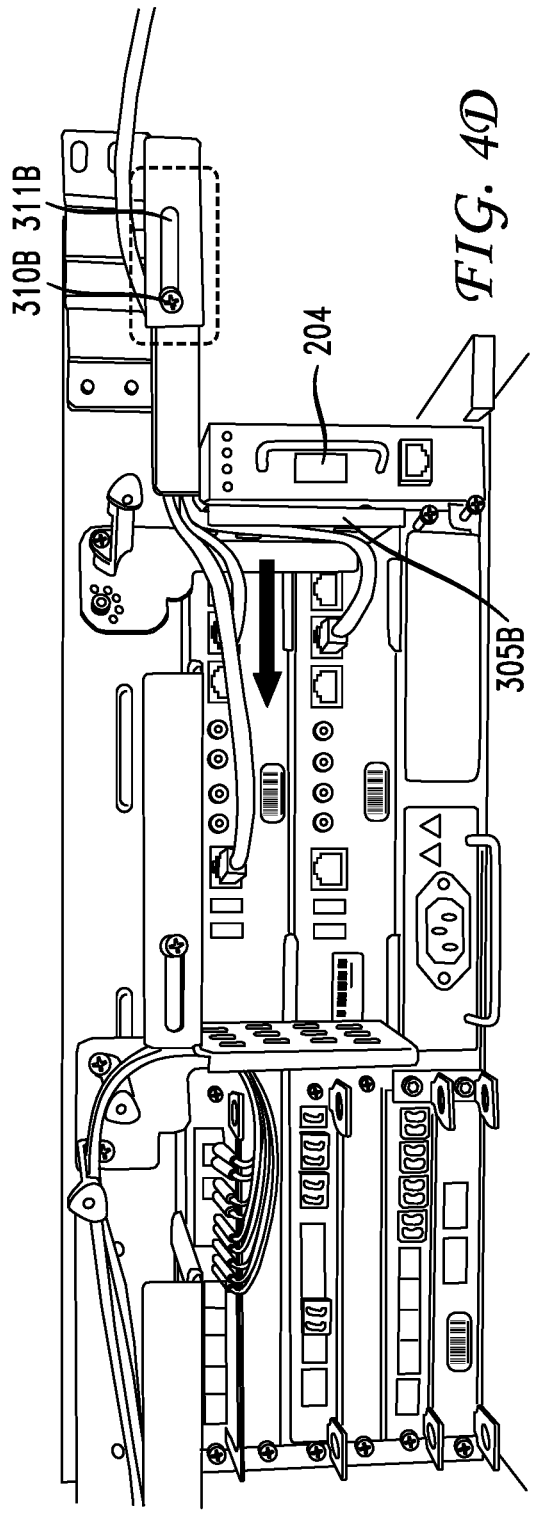

MINIMAL TOUCH BRACKET FOR CABLE ROUTING WITH RACK MOUNTED DEVICES

CROSS REFERENCE TO RELATED APPLICATIONS

This application claims priority to U.S. provisional application No. 62/465,879, filed on Mar. 2, 2017, which is expressly incorporated by reference herein in its entirety.

TECHNICAL FIELD

The present technology pertains to cable routing and more specifically pertains to a device for routing cables attached to rack mounted devices.

BACKGROUND

Traditional cable management mechanisms for rack-mounted devices have become insufficient as rack-mounted devices have been developed that have more ports, and that have a combination of fiber data cables, copper data cables, and copper power cables connected to the same device. Conventional wisdom is that fiber cables and copper cables should remain separated, which complicates cable routing. Additionally, it is considered best practice to not touch or disturb fiber cables that are already installed. Furthermore, its also considered best practice to not bend some cables beyond a specified bend radius To accommodate the above mentioned principles and best practices, current cable routing techniques often exit cables in such a way that cable routing can interfere with access to field replaceable components within a given device. For example, FIG. 1 shows a rack mounted router 102 having field replaceable components such as route switch processors 106, interface modules 108, power supply units 110, and a fan tray 104. However replacing the field replaceable units when cables are routed according to traditional best practices requires removing cables or moving cables from the remaining units, which is undesirable.

BRIEF DESCRIPTION OF THE DRAWINGS

In order to describe the manner in which the above recited and other advantages and features of the disclosure can be obtained, a more particular description of the principles briefly described above will be rendered by references to specific embodiments thereof, which are illustrated, in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIGS. 4A, 4B, 4C, and 4D illustrate example configurations of an embodiment of a minimal touch cable bracket installed above a router;

DESCRIPTION OF EXAMPLE EMBODIMENTS

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

OVERVIEW

The present technology provides minimal touch cable guides for rack mounted devices. The minimal touch cable guides disclosed herein provide structures for routing cables from field replaceable units installed in a rack mounted device in such a way that cables of different types are not crossed and provides a mechanism for adjusting installed cabling to permit access to otherwise obscured field replaceable units. Such adjustment of cabling is provided in a controlled manner that does not impair the performance of the installed cabling.

In one embodiment the present technology includes a cable bend guide arm and a moveable cable guide. The moveable cable guide includes a vertical portion, wherein the movable cable guide is configured to guide a cable to the cable bend guide arm. The cable bend guide arm is in fixed spatial relationship with respect to the movable cable guide, wherein the cable bend guide arm is configured to move in coordination with movement of the moveable cable guide. Furthermore, the moveable cable guide is mounted in a slideable relationship with respect to a rack-mounted device. The moveable guide cable is slidably mounted to a mounting frame by a thumbscrew traversing an oblong opening in the mounting frame and terminating in a threaded hole within the moveable cable guide.

In another embodiment the present technology includes a first cable support arm and a second cable support arm that are pivotally joined together. Each of the first cable support arm and the second cable support arm includes a structural portion and a tie down portion, wherein the structural portion gives strength to the first cable support arm and the second cable support arm, and the tie down portion is configured to receive a cable tie down.

EXAMPLE EMBODIMENTS

Figure 1:
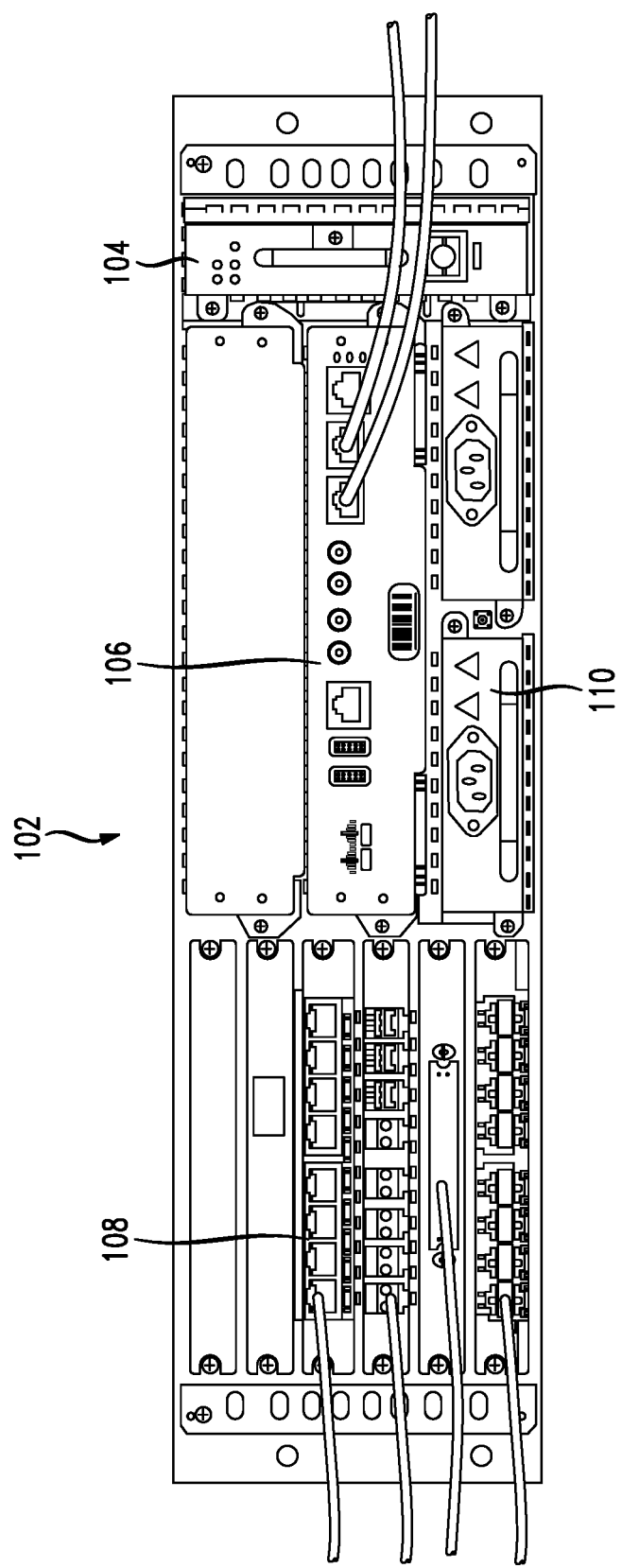
FIG. 1 illustrates an example router with cables routed in a conventional fashion and interfering with fan tray access and with mixed cable types.
Figure 2A:
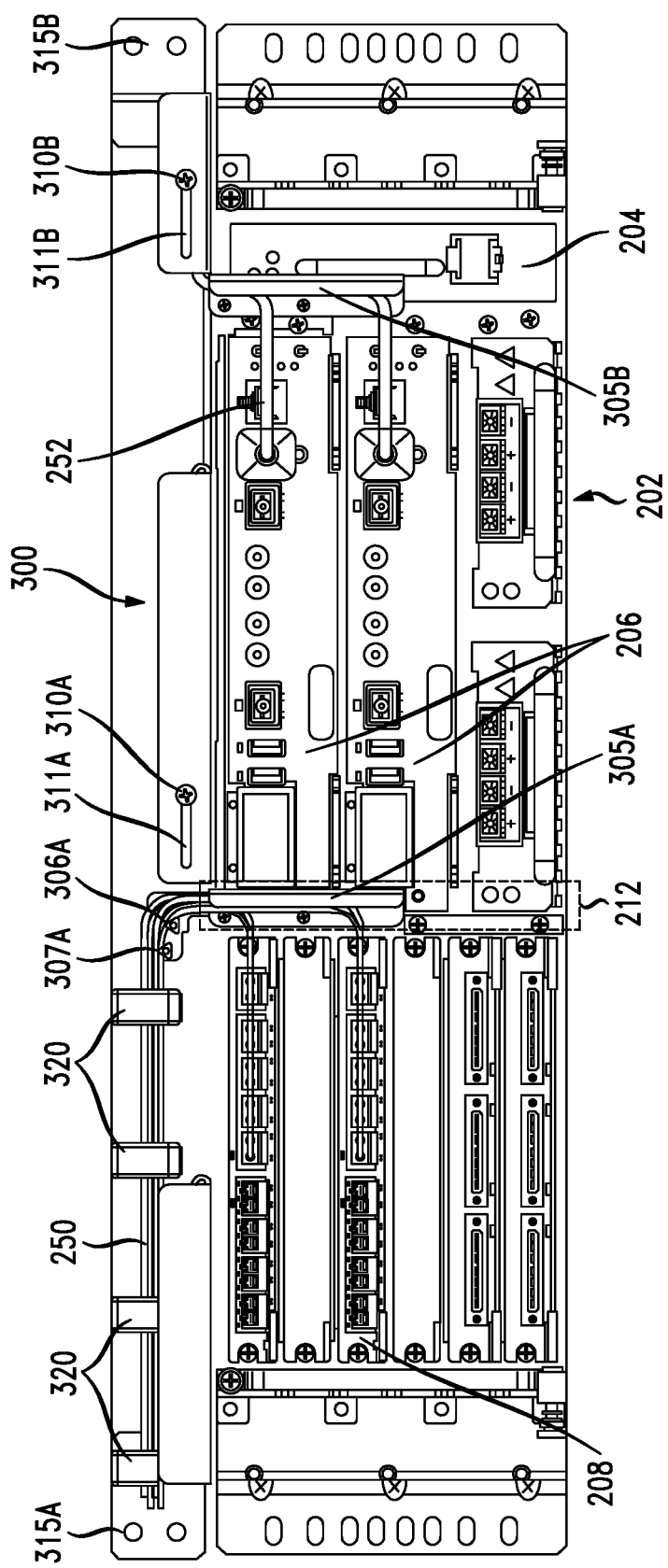
FIG. 2A is a plan view and illustrates a view of an example router with an embodiment of a minimal touch cable bracket.
Figure 2B:
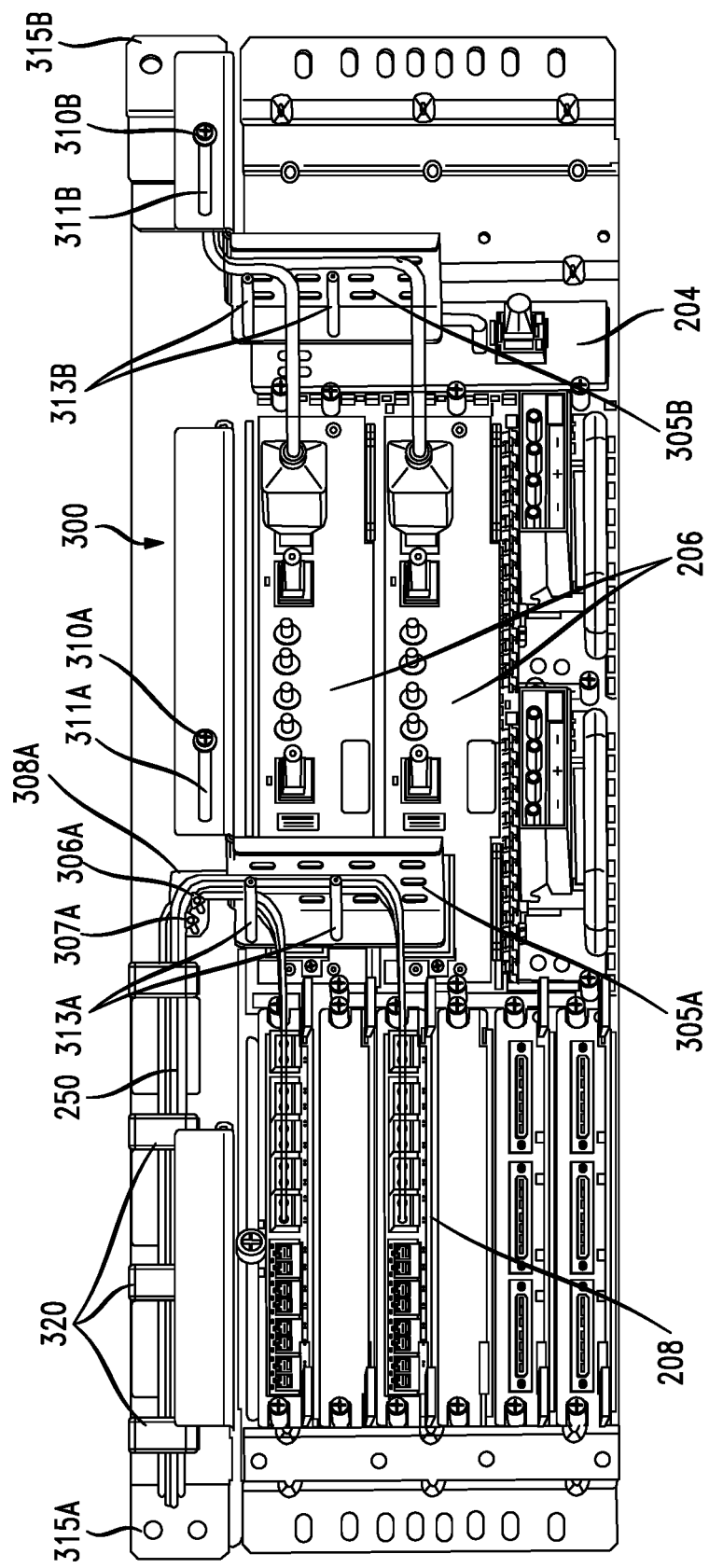
FIG. 2B is a perspective view and illustrates a view of an example router with an embodiment of a minimal touch cable bracket.

FIGS. 2A and 2B illustrate one solution to the problems mentioned above. Bracket 300 can be installed in a rack above router 202 that can guide cables 250, 252 up above router 202 and then exit cables 250, 252 from the rack to the left or right of the rack.

As shown in FIG. 2A cables 250 can be guided from interface cards 208 on the left of router 202 to space 212 between interface card(s) 208 and route switch processor(s) 206 and guided by vertical portion 305A of moveable cable guide 304A up to the top of router 202 and exit the rack to the left of router 202. Channel 212 between interface card(s) 208 and route switch processor(s) 206 is narrow, but wide enough to route cables 250 to the top of router 202 while only minimally blocking access to interface card(s) 208 or route switch processor(s) 206.

Similarly, cable(s) 252 can be guided from route switch processor(s) 206 to vertical portion 305B of movable cable guide 304B to the top of router 202, and cable(s) 252 can be guided to exit the rack on the right of router 202.

Figure 3A:
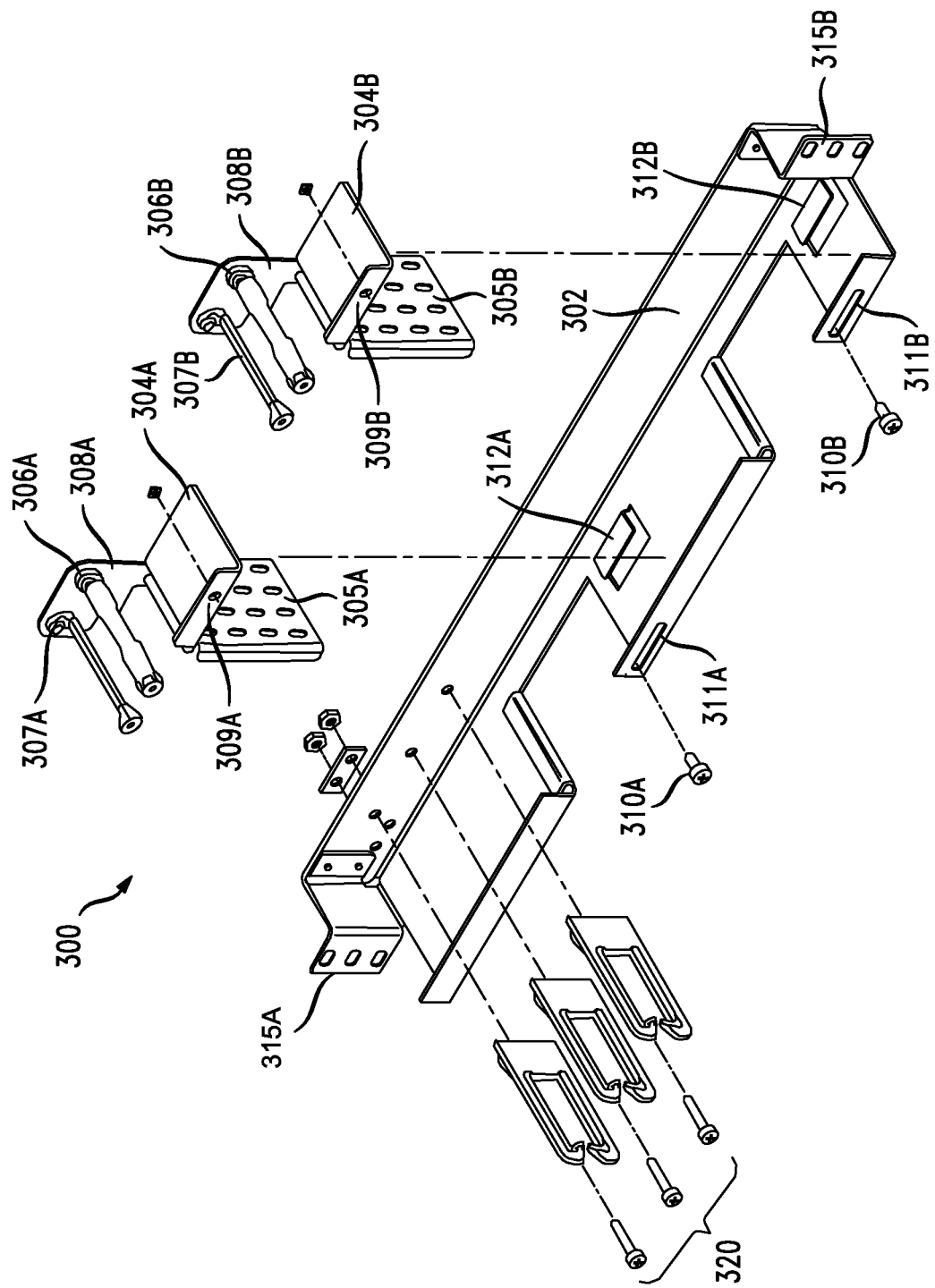
FIG. 3A illustrates an exploded view of an embodiment of a minimal touch cable bracket.
Figure 3B:
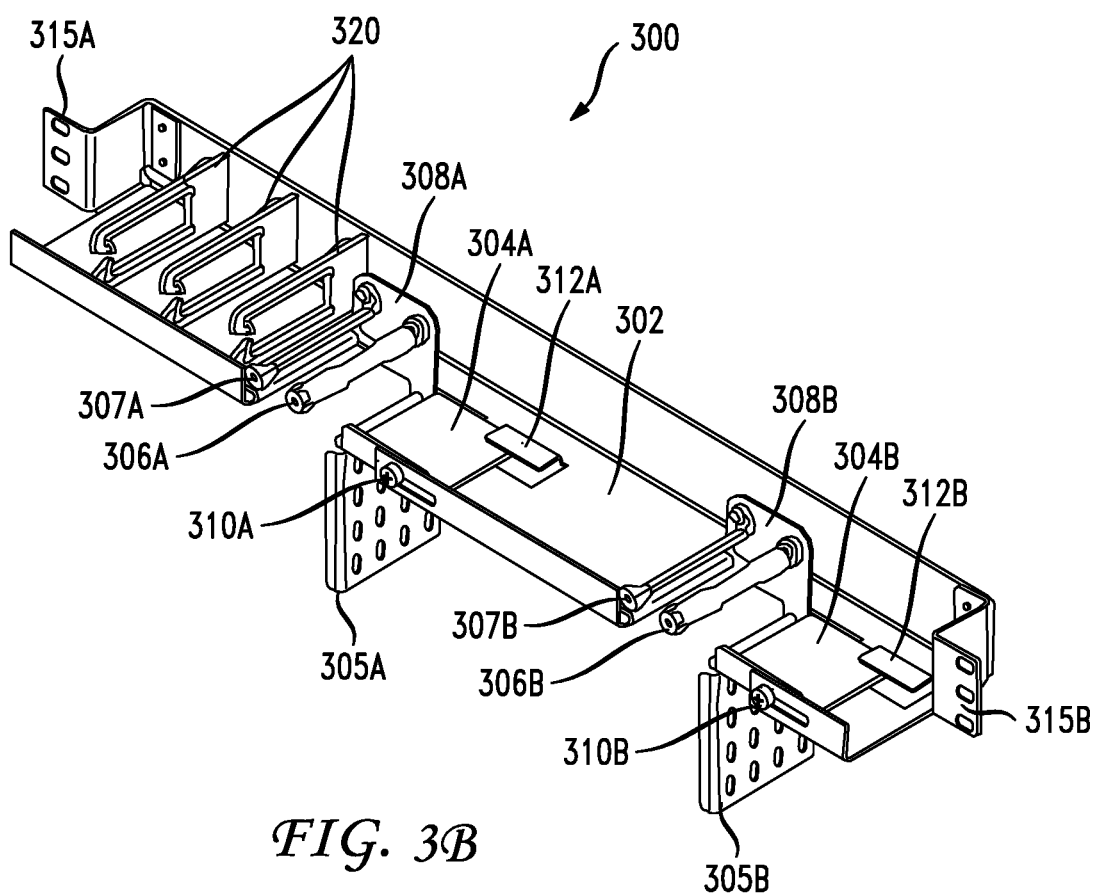
FIG. 3B illustrates an example of an embodiment of a minimal touch cable bracket.

FIGS. 3A and 3B show cable bracket 300 in more detail. Cable bracket 300 is approximately one rack unit (1RU) tall and can be mounted to the rack directly above router 202. Cables 250, 252 coming from the interface cards/route switch processors can be routed directly to vertical portions 305A, 305B of movable cable guides 304A, 304B. Movable cable guides 304A, 304B are slidably mounted to mounting frame 302. Movable cable guides 304A, 304B are in an upside down L configuration, such that the horizontal portions of the movable cable guides 304A, 304B are parallel with the main surface of mounting frame 302 while the vertical portions 305A, 305B of the moveable cable guides are perpendicular to the main surface of mounting platform 302. Vertical portions 305A, 305B of the moveable cable guides 304A, 304B extend below mounting frame 302 and are positioned in front of router 202.

On the left side of router 202 vertical portion 305A of the left movable cable guide 304A is configured to receive cable(s) 250 coming from the interface card(s) 208 installed on the left side of router 202, and is configured to receive a securing mechanism 313A to secure the cables to vertical portion 305A of movable cable guide 304A. Securing mechanism 313A can be straps, wire, tie downs, or other cord. Vertical portion 305A of movable cable guide 304A directs cable(s) 250 up toward mounting frame 302 where the cable(s) 250 is guided around cable bend guide arms 306A, 307A. Cable(s) 250 are next routed through cable management bracket(s) 320, which neatly secure the cable(s) 250 as it is directed to the left side of router 202. Cable bend guide arms 306A, 307A are positioned with respect to vertical portion 305A of movable cable guide 304A so that a minimum bend radius of cable(s) 250 is preserved. Cable bend guide arms 306A, 307A are fixed to guide plate 308A, which is itself fixed to moveable cable guide 304A, thus maintaining a fixed spatial relationship of cable bend guide arms 306A, 307A with respect to moveable cable guide 304A. Moveable cable guide 304A is attached to mounting frame 302 by positioning horizontal portion of moveable cable guide 304A under raised lip 312A of mounting frame 302, and also is slidably secured to mounting frame 302 by thumbscrew 310A traversing oblong opening 311A of mounting frame 302 and is ultimately received within a threaded hole or receiver 309A within moveable cable guide 304A. As illustrated by FIG. 3B, the receiver 309A aligns with the oblong opening 311A on a side of the oblong opening 311A facing the mounting frame 302, that is, on a mounting frame-facing side of the oblong opening 311A.

On the left side of router 202 vertical portion 305A of the left movable cable guide 304A is configured to receive cable(s) 250 coming from the interface card(s) 208 installed on the left side of router 202, and is configured to receive a securing mechanism 313A to secure the cables to vertical portion 305A of movable cable guide 304A. Securing mechanism 313A can be straps, wire, tie downs, or other cord. Vertical portion 305A of movable cable guide 304A directs cable(s) 250 up toward mounting frame 302 where the cable(s) 250 is guided around cable bend guide arms 306A, 307A. Cable(s) 250 are next routed through cable management bracket(s) 320, which neatly secure the cable(s) 250 as it is directed to the left side of router 202. Cable bend guide arms 306A, 307A are positioned with respect to vertical portion 305A of movable cable guide 304A so that a minimum bend radius of cable(s) 250 is preserved. Cable bend guide arms 306A, 307A are fixed to guide plate 308A, which is itself fixed to moveable cable guide 304A, thus maintaining a fixed spatial relationship of cable bend guide arms 306A, 307A with respect to moveable cable guide 304A. Moveable cable guide 304A is attached to mounting frame 302 by positioning horizontal portion of moveable cable guide 304A under raised lip 312A of mounting frame 302, and also is slidably secured to mounting frame 302 by thumbscrew 310A traversing oblong opening 311A of mounting frame 302 and is ultimately received within a threaded hole or receiver 309B within moveable cable guide 304A. As illustrated by FIG. 3B, the receiver 309B aligns with the oblong opening 311B on a side of the oblong opening 311B facing the mounting frame 302, that is, on a mounting frame-facing side of the oblong opening 311B.

Cable bracket 300 can be secured by bolts to a rack at left end 315A and right end 315B of cable bracket 300. In some embodiments, cable bracket 300 could be mounted directly to router 202 instead of being mounted to a rack.

In some embodiments, while the various figures illustrate cable bend guide arms 306A, 306B, 307A, 307B fixed to guide plate 308A, 308B, which is fixed to moveable cable guide 304A, 304B, other mechanisms can be used to maintain a fixed or approximately spatial relationship between the cable guide arms and the moveable cable guide. For example, gearing, springs, or other mechanisms can be used to ensure that cable bend guide arms move enough to maintain a minimum bend radius of cabling.

The cable bracket 300 illustrated in FIGS. 2A, 2B, 3A and 3B not only guides cable(s) 250, 252 from interface card(s) 208 of router 202 up and away from router 202, but also facilitates removal and replacement of field replaceable components such as line card(s) 208, route switching processor(s) 206, fan module 204, etc. Referring back to FIG. 2A where cabling 250 can be seen being routed up between interface card(s) 208 and route switch processor(s) 206, it will be appreciated that the area 212 between interface card(s) 208 and route switch processor(s) 206 is relatively narrow. If an interface card 208 needed to be replaced, it would benefit the technician if cabling 205 were moved slightly to the right to permit egress of the old interface card and ingress of the new interface card.

Cable bracket 300 described herein allows for minimal and controlled movement of cabling 250 to permit egress of the old interface card and ingress of the new interface card without cable(s) 250 interfering with access to interface card(s) 208. FIGS. 7A-7D illustrate a method of replacing a field replaceable unit such as an interface card. Movable cable guide 304A is secured to the mounting frame by thumb-tightened screw 310A. Thumb-tightened screw 310A can be loosened (602) by hand to permit motion (604) of the movable cable guide with respect to mounting frame 302. Since the cable(s) 250 is attached to vertical portion 305A of movable cable guide 304A when movable cable guide 304A is slid slightly (604) to the right cable(s) 250 will move with movable cable guide 340A, thus permitting access to the interface card(s) 208. Likewise should route switch processor(s) 206 need to be replaced movable cable guide 304A can be moved slightly to the left to permit access to route switch processor(s) 204. Such motion of movable cable guide 304A is minor and controlled so as to not disturb the routing of cable(s) 250 coming out of interface card(s) 208. With clear access to the field replaceable unit such as a line card, route switch processor, fan module, power module, etc, the field replaceable unit can be replaced (606).

Such adjustment of movable cable guide 304A is illustrated in FIG. 4A. In FIG. 4A vertical portion 305A of movable cable guide 304A is shown positioned in the right most position. Thumbscrew 310A is positioned at the far right of oblong opening 311A of mounting frame 302. In this configuration vertical portion 305A of movable cable guide 304A does not obstruct access to interface card(s) 208, but does obstruct access to route switch processor(s) 206. Cable 250 remains secured to vertical portion 305A of movable cable guide 304A and remains routed through the cable guide 306A and 307A such that a minimum bend radius of cable 250 is maintained.

When access to route switch processors 206 is needed, thumbscrew 310A can be loosened (602) and slid (604) to the left of oblong opening 311A, thereby positioning vertical portion 305A of movable cable guide 304A in front of interface card(s) 208 and permitting clear access to route switch processor(s) 206. Cable 250 remains secured to vertical portion 305A of movable cable guide 304A and remains routed through cable guide 306A and 307A such that a minimum bend radius of cable 250 is maintained.

In addition to movable cable guide 304A positioned between interface card(s) 208 and route switch processor(s) 206 there is a second movable cable guide 304B positioned between route switch processor(s) 206 and fan module 204. Cabling 252 coming out of route switch processor(s) 206 can be secured to vertical portion 305B of second movable cable guide 304B and can be operated in the same fashion as the first movable cable guide 304A as illustrated in FIGS. 4C and 4D. Using the second movable cable guide 304B cabling 252 can be moved in a controlled fashion slightly to the left to allow access to fan module 204 or can be moved slightly to the right to permit access to the route switch processor(s) 206. With clear access to the field replaceable unit such as a line card, route switch processor, fan module, power module, etc., the field replaceable unit can be replaced (606), and movable cable guide 304A can be secured by tightening (608) thumbscrew 310A.

FIG. 4C illustrates vertical portion 305B of movable cable guide 304B positioned in a right-most configuration whereby vertical portion 305B of movable cable guide 304B blocks access to fan module 204. Thumbscrew 310 is shown at the right-most portion of oblong opening 311B of mounting frame 302. FIG. 4D illustrates the vertical portion 305B of movable cable guide 304B positioned in a left most configuration whereby vertical portion 305B of movable cable guide 304B permits access to fan module 204, but obstructs access to route switch processor(s) 206. Thumbscrew 310 is shown at the left-most portion of oblong opening 311B of mounting frame 302. With clear access to the field replaceable unit such as a line card, route switch processor, fan module, power module, etc., the field replaceable unit can be replaced (606), and movable cable guide 304B can be secured by tightening (608) thumbscrew 310B.

Figure 5A:
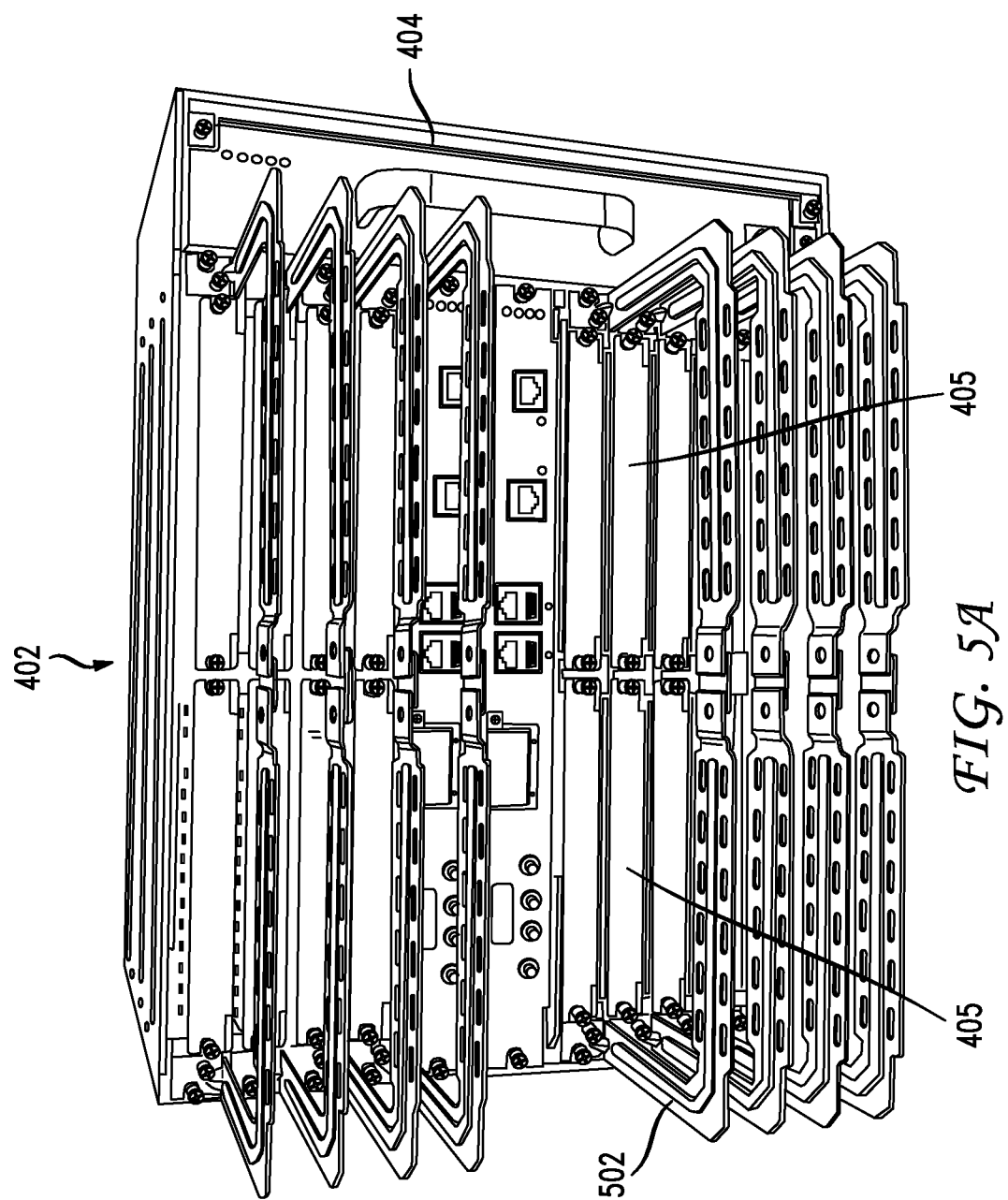
FIGS. 5A and 5B illustrate an example views of a router with embodiment of a minimal touch cable bracket.
Figure 5B:
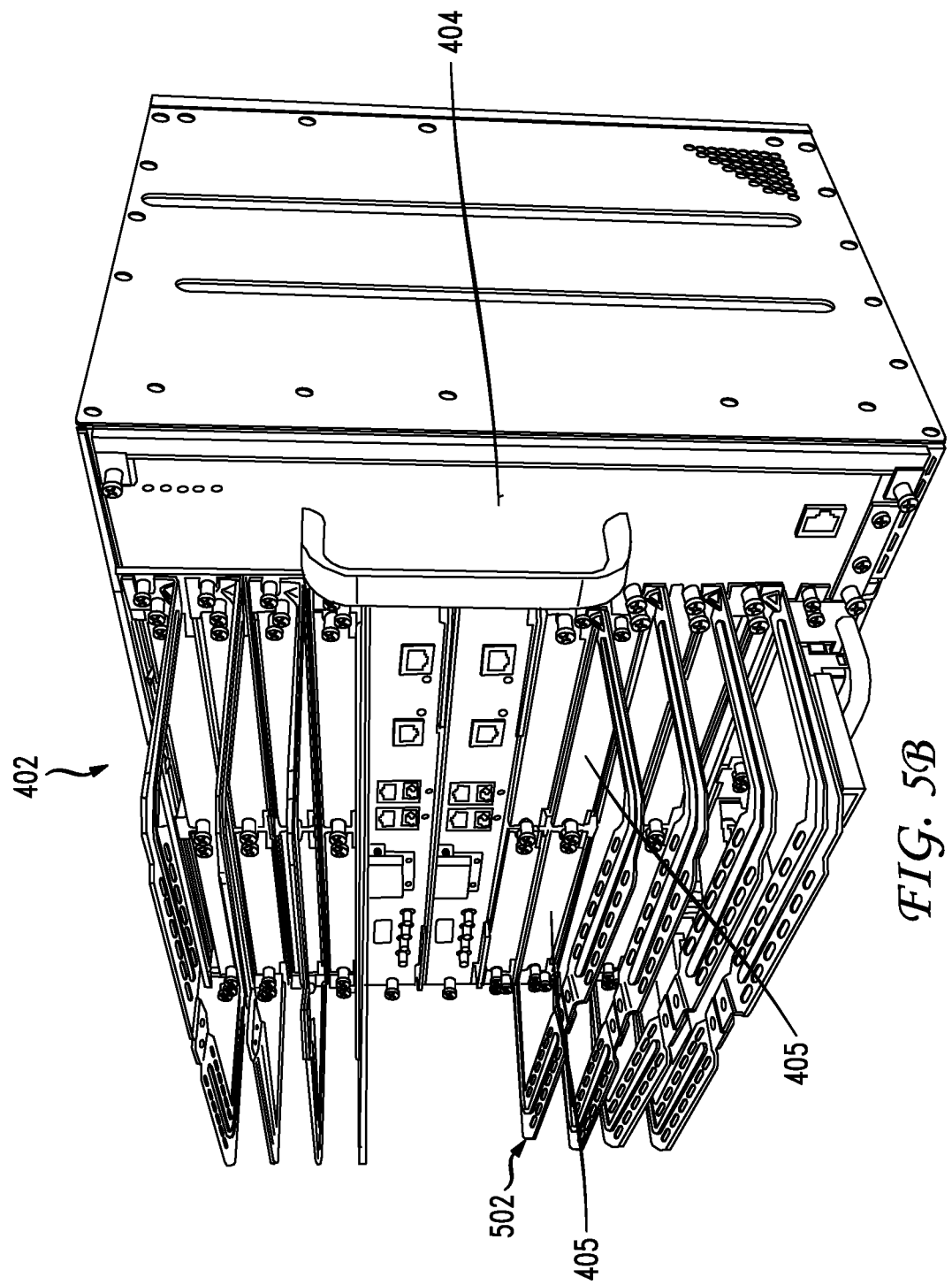

FIGS. 5A and 5B illustrate views of another example router 402. In router 402 interface card(s) 405 are stacked in to columns directly adjacent to each other such that there is a column of interface cards on the left and a column of interface cards on the right. In this router configuration fan module 404 is to the right of interface card(s) 405. Unlike the router illustrated in FIGS. 2A-2B, there is not enough room in between field replaceable units located adjacent to each other (left column and right column of line cards) to route cable. FIGS. 5A and 5B also illustrate an embodiment of a minimal touch bracket 502.

Figure 6A:
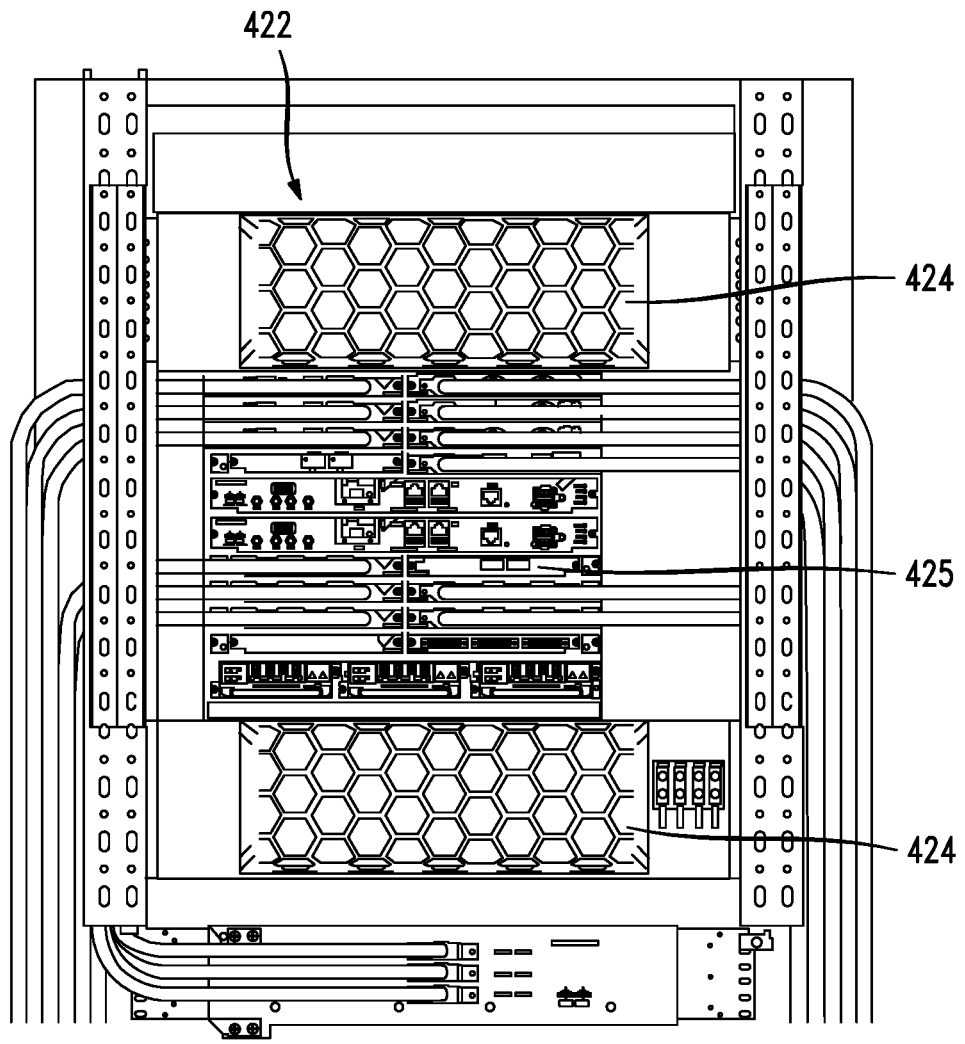
FIGS. 6A and 6B illustrate an example views of a router with embodiment of a minimal touch cable bracket.
Figure 6B:
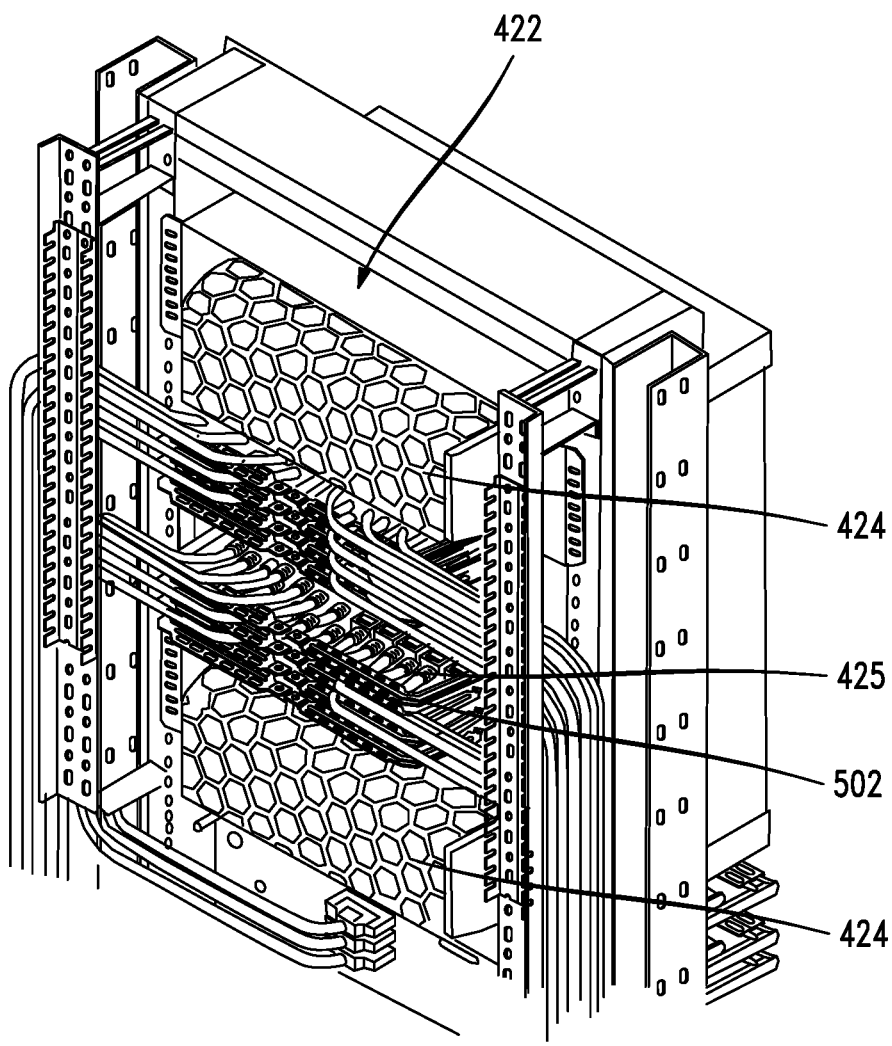

FIGS. 6A and 6B illustrate views of another example router 422. In router 422 interface card(s) 425 are stacked in to columns directly adjacent to each other such that there is a column of interface cards on the left and a column of interface cards on the right—just as with router 402 and line cards 405 in FIGS. 5A and 5B. In this router configuration fan modules 424 are above and below interface card(s) 425. Just as with router 402, there is not enough room in between field replaceable units located adjacent to each other (left column and right column of line cards 425) to route cable. FIGS. 6A and 6B also illustrate an embodiment of a minimal touch bracket 502, which is positioned in the same way relative to the line cards 425 as illustrated in FIGS. 5A and 5B.

Figure 7A:
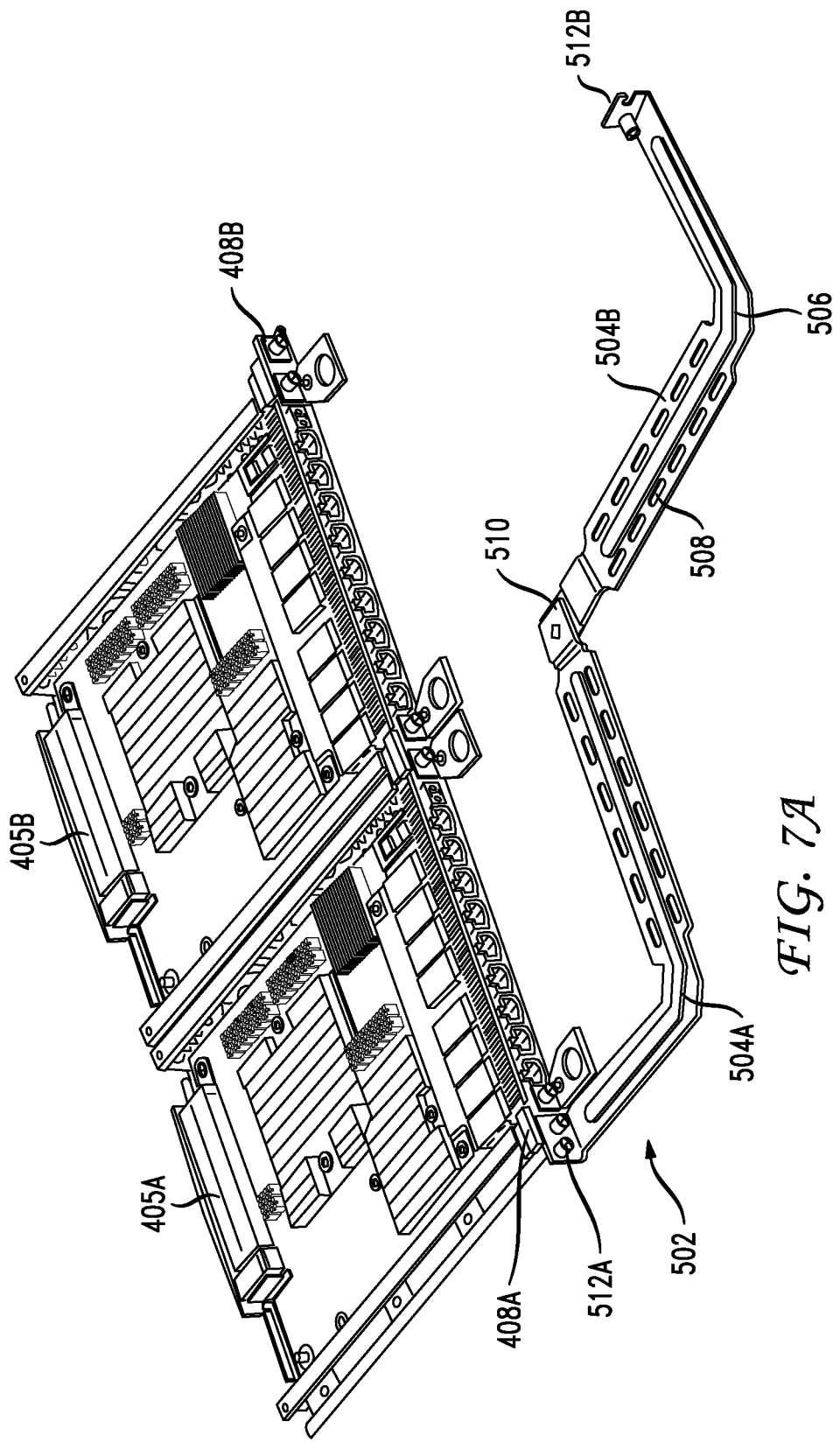
FIG. 7A illustrates an example view of a line card with an embodiment of a minimal touch cable bracket.

FIG. 7A is a detail view of one pair of line cards in the arrangement used by the routers in FIGS. 5 and 6. FIG. 7A illustrates two interface cards 405A, 405B next to each other—one on the left, and one on the right. FIG. 7A also illustrates an embodiment of a type of minimal touch cable bracket 502.

The objectives of the embodiment illustrated in FIGS. 5-8 are similar to the objectives of the embodiment illustrated in FIGS. 1-4, wherein it is desirable to route cabling to the sides of the router without obscuring other components, avoiding crossing of cables of different types, and allowing for field replaceable components of the router to be replaced without disturbing cabling already in place.

Figure 7B:
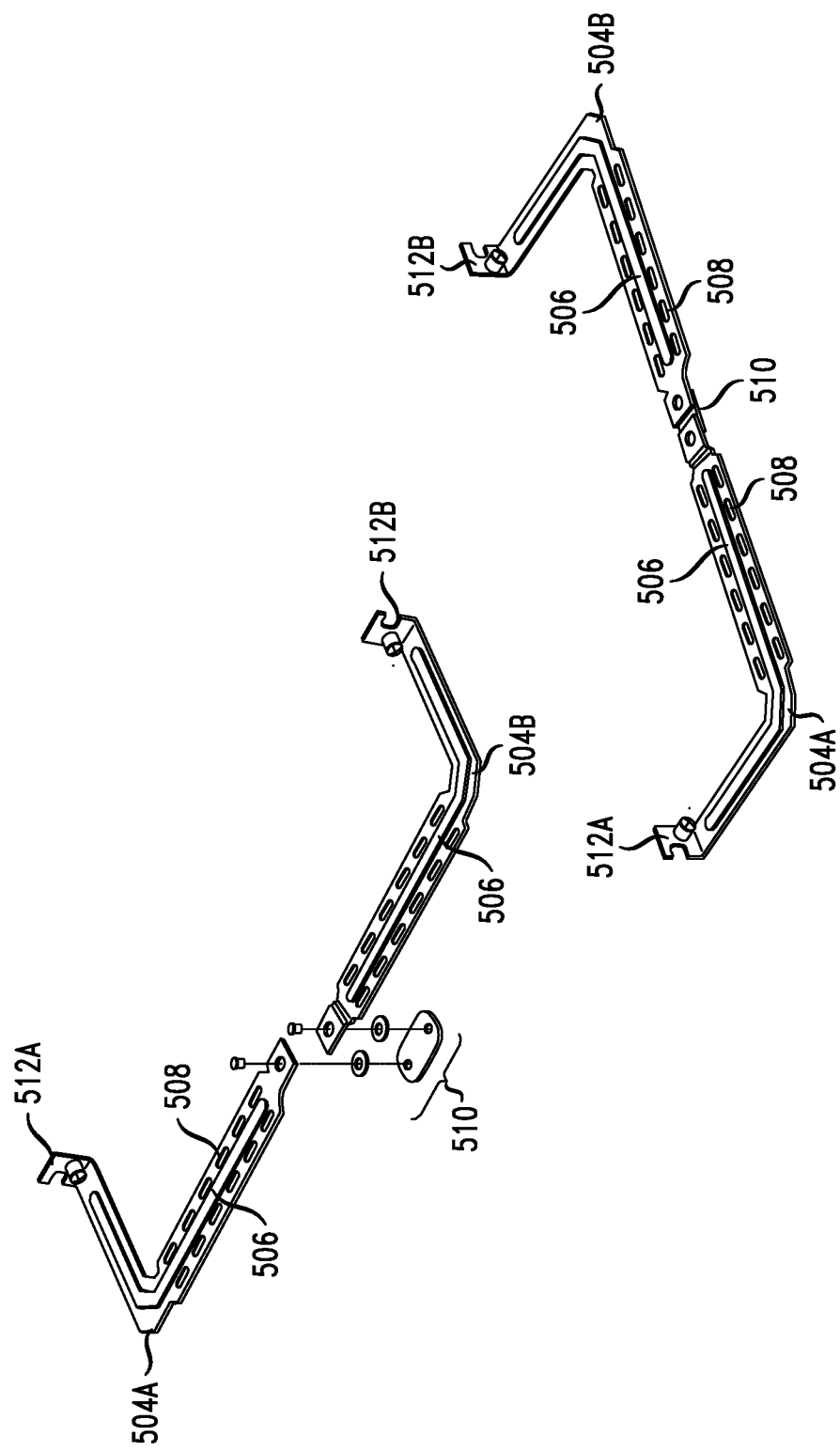
FIG. 7B illustrates an example view of an embodiment of a minimal touch cable bracket.

The bracket shown in FIGS. 7A and 7B has attachment points 512A, 512B—on the left end 512A and right end 512B. The left attachment point 512A attaches to the left 408A of the left line card and the right attachment point 512B attaches to the right 408B of the right line card. In the middle of bracket 502 is a hinge or pivot 510. In some embodiments bracket 502 can be formed of a rigid metal such as iron or steel. However bracket 502 must be thin enough to be mounted in front of the line cards and to support cabling and still not obscure other line cards above or below. While bracket 502 must be thin it must also be strong enough to support cabling.

Figure 7C:
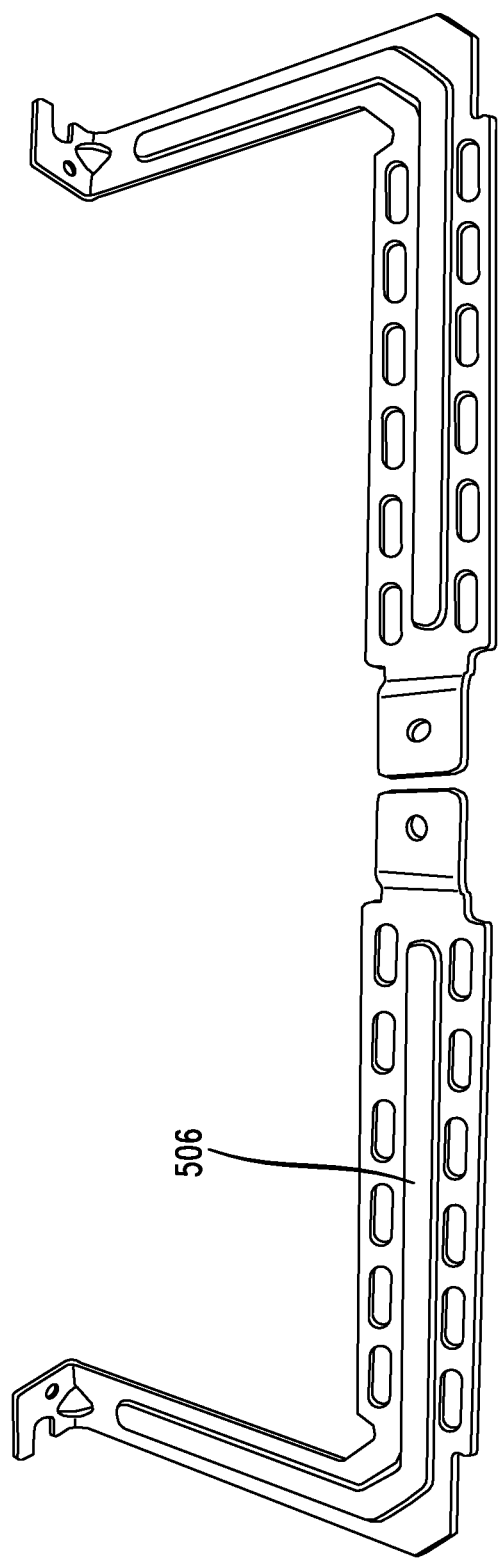
FIG. 7C illustrates an example top view of an embodiment of a minimal touch cable bracket.
Figure 7D:
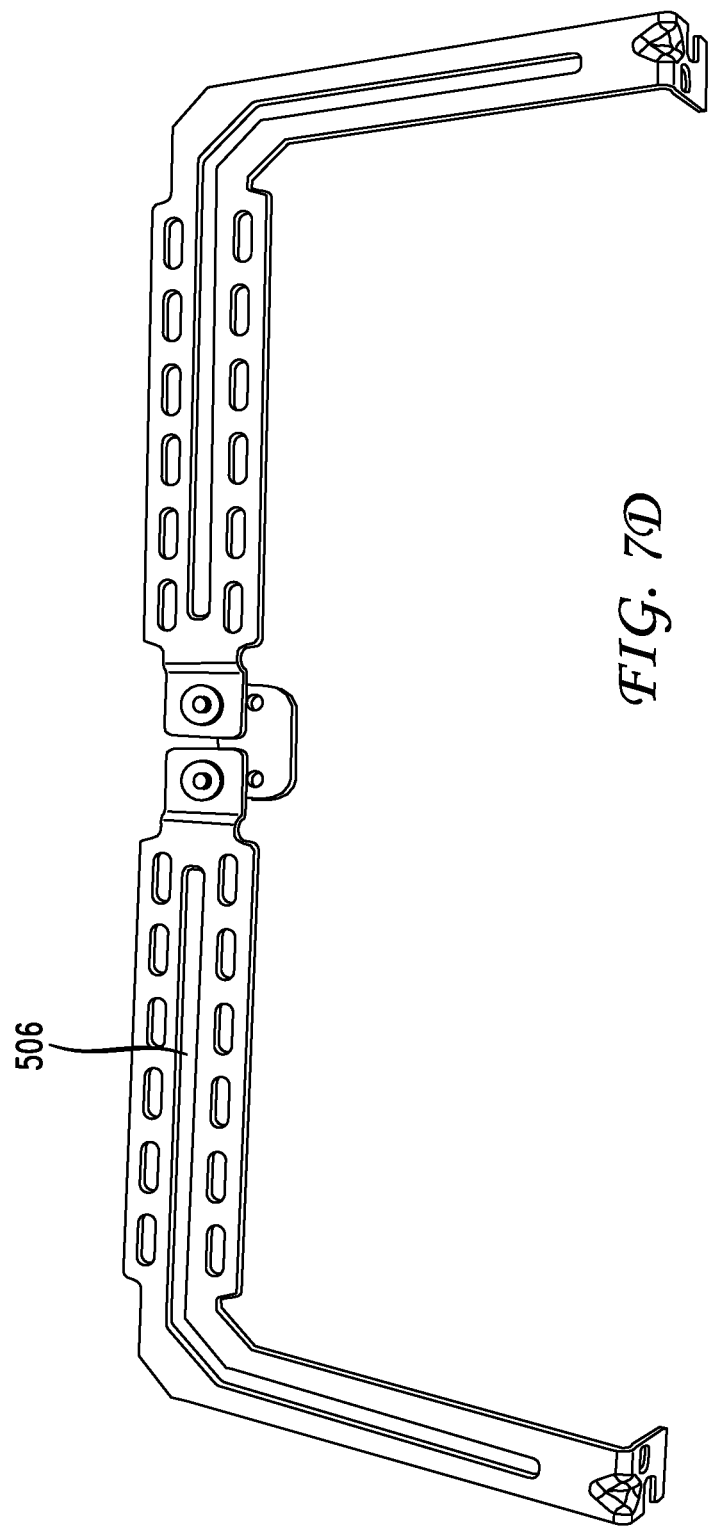
FIG. 7D illustrates an example bottom view of an embodiment of a minimal touch cable bracket.

As illustrated in FIGS. 7C and 7D, to provide additional structure, bracket 502 includes structural portion 506. Structural portion 506 can be an artery of thickened material, or formed channel (made from stamping or molding). FIG. 7C is a top view of bracket 502 showing structural portion 506 being a raised artery, created by a formed channel on the reverse side (shown in FIG. 7D, which is a bottom view of bracket 502).

Bracket 502 also includes a series of tie down portions 508, which can be openings or other attachment mechanisms to allow for tie downs to secure cabling in place.

In operation, cabling coming out of left line card 405A would be directed to left arm 504A of bracket 502, and secured to bracket 502 and run out to the left side of line card 405A. Likewise cable coming out of right line card 405B would be directed to right arm 504B of the bracket 502 and secured to bracket 502 and run out to the right side of router 402.

When one of the line cards and needs to be replaced (for example right line card 405B), the right line card cabling would be removed from right arm 504B of bracket 502 and bracket 502 would be unsecured (602) at attachment point 512B which would allow for bracket 502 to pivot (604) at pivot 510 to permit access to right line card 405B. When right line card 405B is replaced (606) bracket 502 can again be secured by securing (608) attachment point 512 on bracket 502 to attachment point 408 to the right of right line card 405B, and cabling can be routed from line card 405B and secured to right arm 504B of bracket 502 and directed out to the right side of router 402.

Figure 8A:
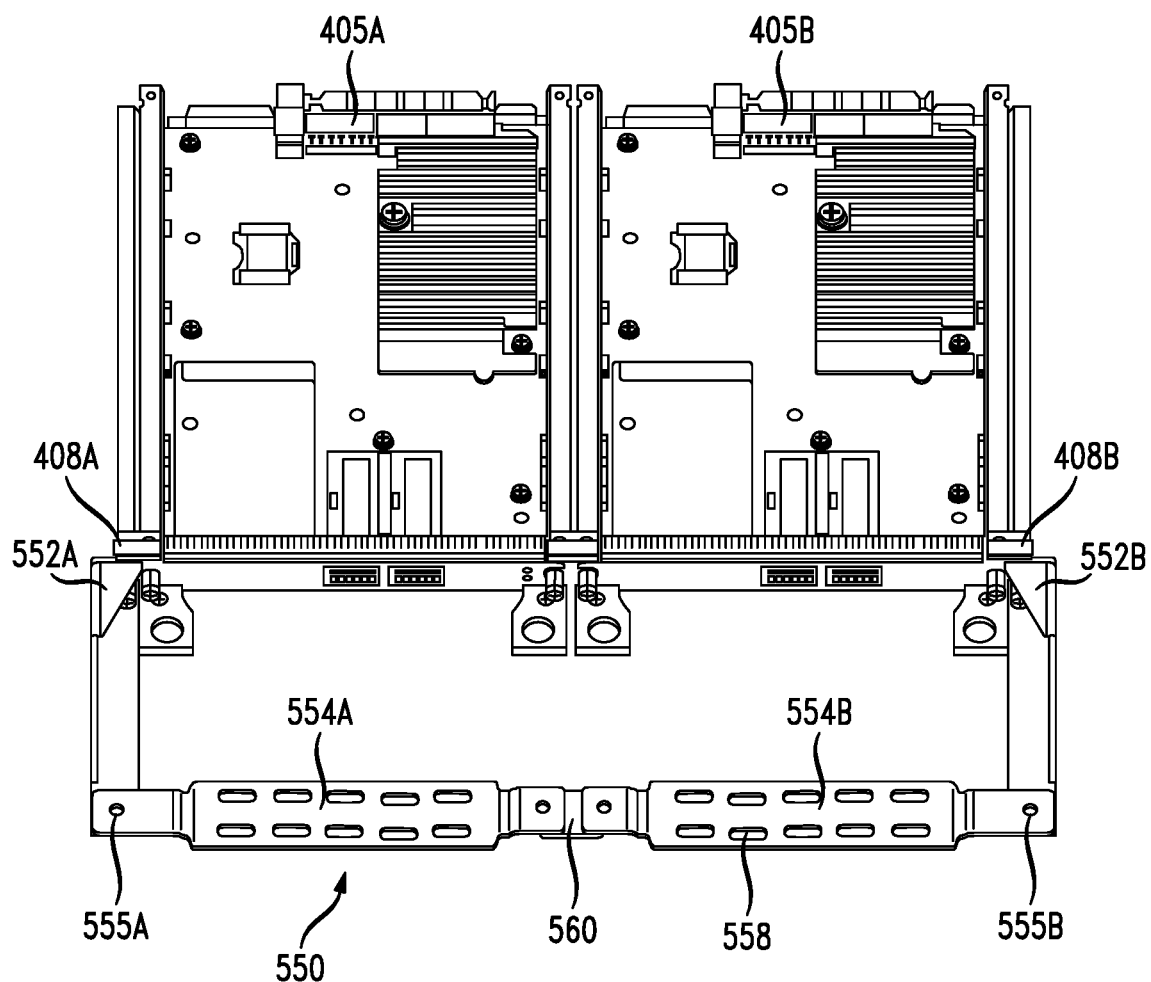
FIG. 8A illustrates an example view of a line card with an embodiment of a minimal touch cable bracket.
Figure 8B:
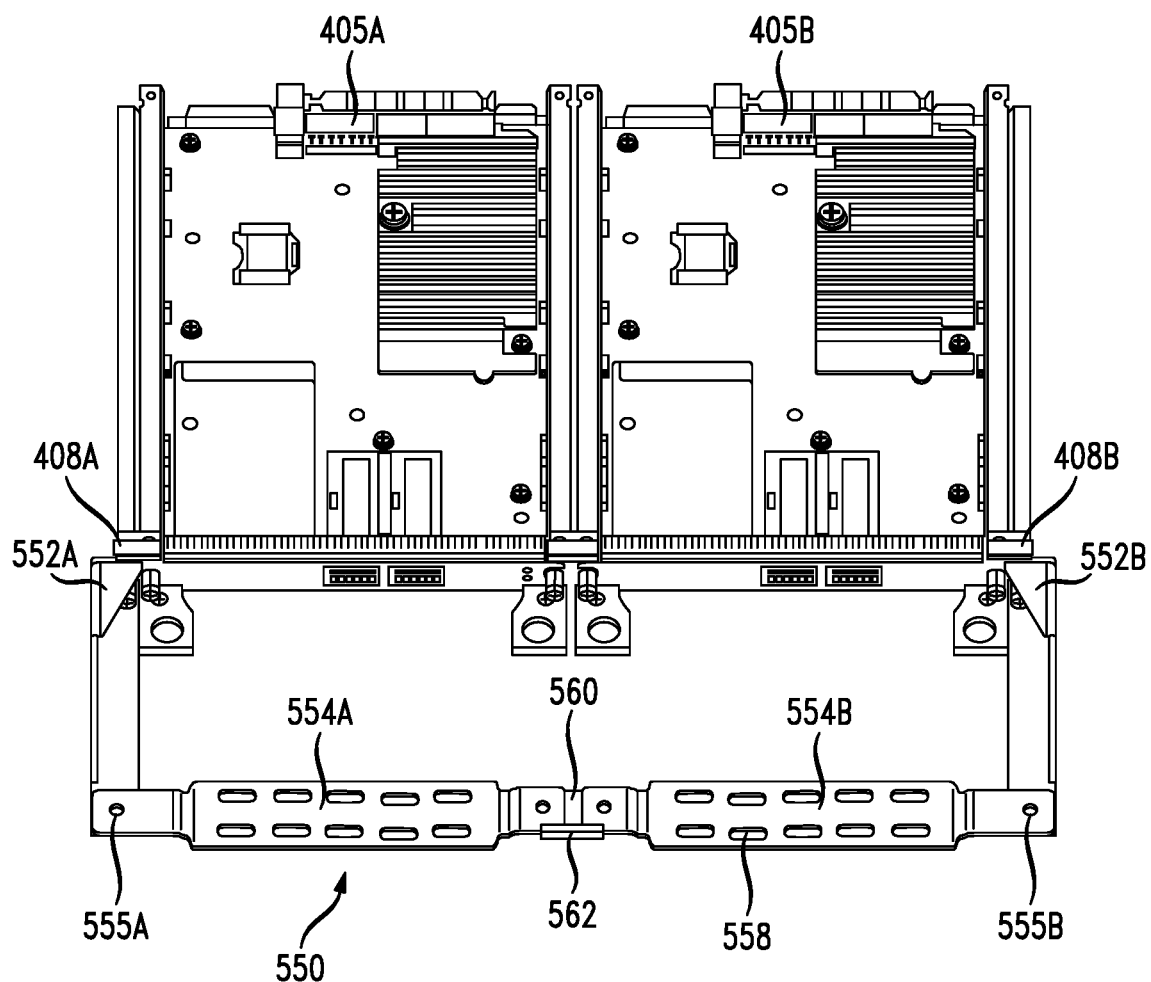
FIG. 8B illustrates an example view of a line card with an embodiment of a minimal touch cable bracket.
Figure 8C:
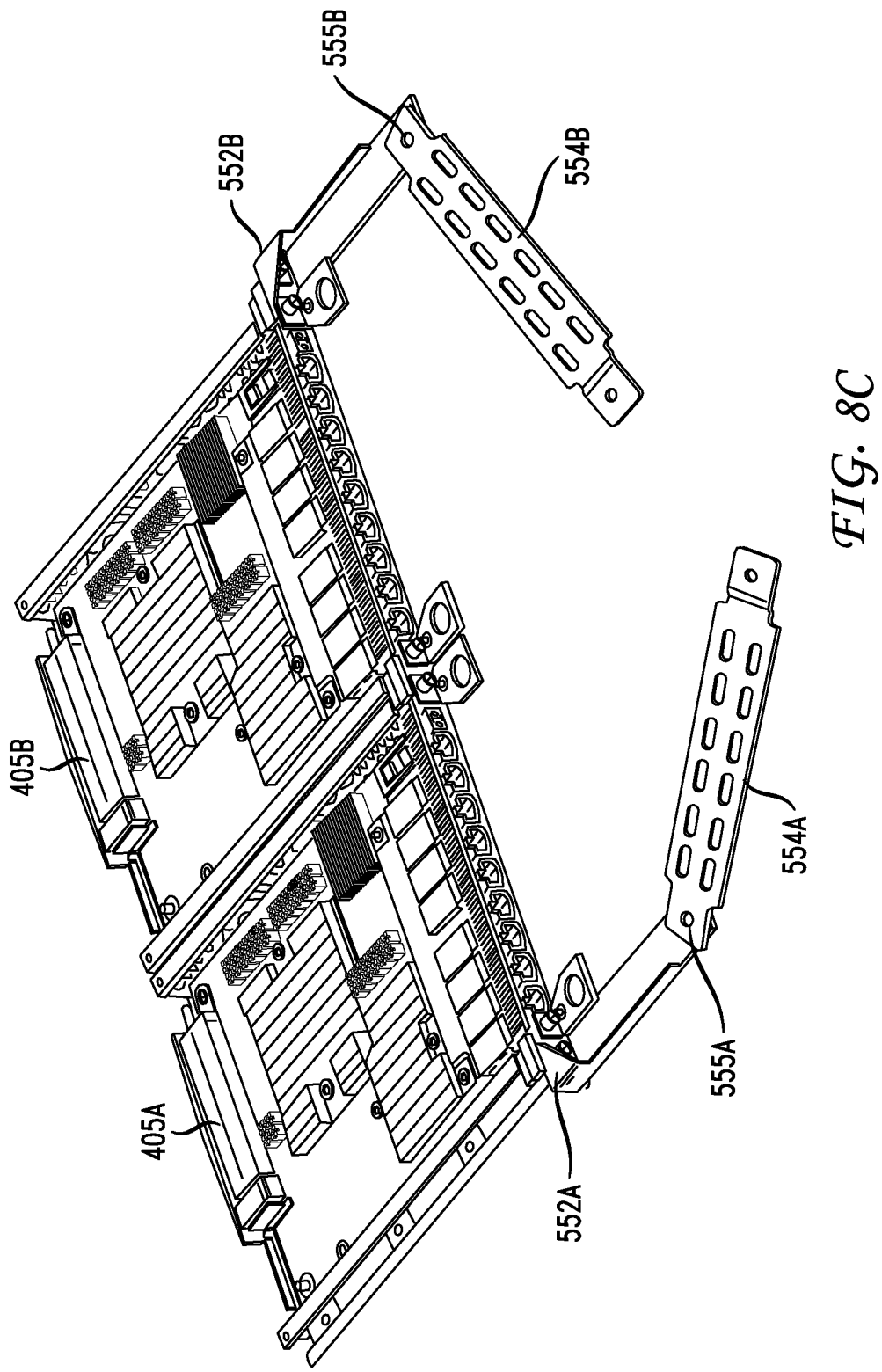
FIG. 8C illustrates an example view of a line card with an embodiment of a minimal touch cable bracket.

FIGS. 8A and 8B are detail views of one pair of line cards in the arrangement used by the routers in FIGS. 5 and 6. FIG. 8A illustrates two interface cards 405A, 405B next to each other—one on the left, and one on the right. FIGS. 8A and 8B also illustrates configurations of an embodiment of a type of minimal touch cable bracket 550.

The bracket shown in FIGS. 8A and 8B has attachment points 552A, 552B—on the left end 552A and right end 552B. The left attachment point 552A attaches to the left 408A of the left line card and the right attachment point 552B attaches to the right 408B of the right line card. The main different between bracket 504 and bracket 550 is in the arrangement of hinge(s). Bracket 550 includes three hinges, cable support arm hinge 555A on the left, cable support arm hinge 555B on the right, and decoupable pivot 560 in the middle. Decoupable pivot 560 can either operate as a hinge or as a decoupable connection point between left arm 554A and right art 554B. When arms 554A and 554B are connected and decoupable pivot 560 is not flexed, clasp 562 can be removably installed to provide additional structure.

In some embodiments bracket 502 can be formed of a rigid metal such as iron or steel. However bracket 502 must be thin enough to be mounted in front of the line cards and to support cabling and still not obscure other line cards above or below. While bracket 502 must be thin it must also be strong enough to support cabling.

Bracket 550 also includes a series of tie down portions 558, which can be openings or other attachment mechanisms to allow for tie downs to secure cabling in place.

In operation, cabling coming out of left line card 405A would be directed to left arm 554A of bracket 550, and secured to bracket 550 and run out to the left side of line card 405A. Likewise cable coming out of right line card 405B would be directed to right arm 554B of bracket 550 and secured to bracket 550 and run out to the right side of a router.

When one of the line cards and needs to be replaced (for example right line card 405B), the right line card, bracket 550 provides at least two options. In one option, illustrated in FIG. 8C, clasp 562 can be removed from decoupable pivot 560, and decoupable pivot 560 can be decoupled (602) to allow free movement of arm 554B. In this option of operation, it may not be necessary to remove cabling from arm 554B. Instead arm 554B can be pivoted (604) at cable support arm hinge 555B to the right with the cables still attached to arm 554B, and make room to provide access to line card 405B. Line card 405B can then be replaced (606) and decouplable pivot 560 can be rejoined (608) and reinforced with clasp 562.

In another option, bracket 550 can operate similar to that shown for bracket 502 in FIG. 7A. Using this option cabling would be removed from right arm 554B of bracket 550 and bracket 550 would be unsecured (602) at attachment point 552B which would allow for bracket 550 to pivot (604) at cable support arm hinge 555A (and pivot at 560 if clasp 562 were removed) to permit access to right line card 405B. When right line card 405B is replaced (606) bracket 550 can again be secured by securing (608) attachment point 552B on bracket 550 to attachment point 408B to the right of right line card 405B, and cabling can be routed from line card 405B and secured to right arm 554B of bracket 550 and directed out to the right side of the router.

Figure 9:
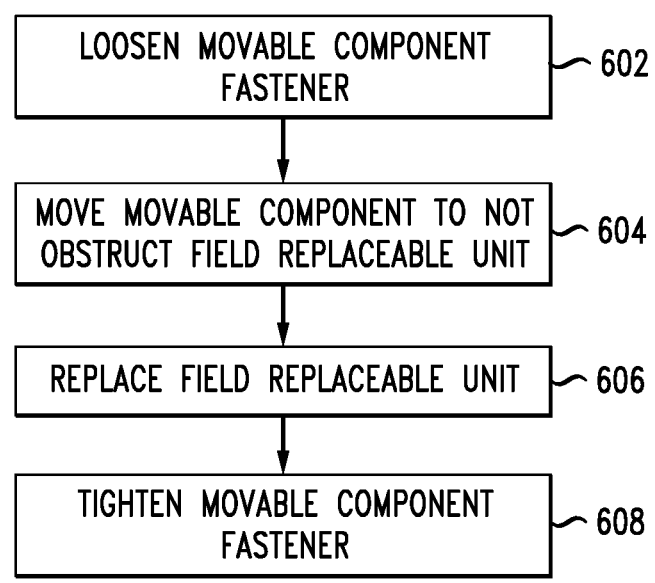
FIG. 9 illustrates an example method of replacing a field replaceable unit.

FIG. 9 illustrates an example method for using the minimal touch brackets disclosed herein. First, a faster needs to be loosened (602). In the brackets illustrated in FIGS. 3A and 3B, these are thumb screws 310A or 310B. In the brackets illustrated in FIGS. 7A, 7B, 7C, 7D, 8A and 8B, these are securing screws at attachment points 512A 512B, 552A, 552B.

Next, a moveable component of the minimal touch bracket needs to be moved (604) out to not obstruct a field replaceable unit needing to be replaces. In the brackets illustrated in FIGS. 3A and 3B, these are vertical portions 305A or 305B. In the brackets illustrated in FIGS. 7A, 7B, 7C, 7D, 8A and 8B, these are arm(s) 506, and 554.

Next, field replaceable units are replaced (606), and the bracket can be restored to its installed configuration and the moveable component fasteners can be tightened (608).

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. A cable guide bracket comprising:
   a cable bend guide arm; and
   a moveable cable guide defined by a vertical portion extending perpendicular to a horizontal portion, the moveable cable guide including a fastener removably secured to a receiver, the moveable cable guide configured to guide a cable to the cable bend guide arm, the horizontal portion configured to be slidably mounted to a mounting frame by extending the fastener through an oblong opening in the mounting frame and into the receiver, with the horizontal portion on a mounting frame-facing side of the oblong opening.

2. The cable guide bracket of claim 1, further comprising:
   a cable securement bracket connected to the mounting frame.

3. The cable guide bracket of claim 1,
   wherein, the moveable cable guide is "L" shaped and is defined by the vertical portion and the horizontal portion,
the horizontal portion includes the receiver, and
the vertical portion is configured to guide the cable to the cable bend guide arm.

4. The cable guide bracket of claim 1, wherein the cable guide bracket is configured to be mounted, via the mounting frame, to a rack above a rack-mounted device benefiting from cable management by the moveable cable guide.

5. The cable guide bracket of claim 1,
wherein,
the moveable cable guide and the cable bend guide arm are position in a fixed spatial relationship, and
the cable bend guide arm is configured to move in coordination with movement of the moveable cable guide.

6. The cable guide bracket of claim 1, wherein the cable bend guide arm is fixed to the moveable cable guide via a plate.

7. The cable guide bracket of claim 6, wherein the plate defines a relationship between the cable bend guide arm and the moveable cable guide.

8. The cable guide bracket of claim 1,
wherein,
the moveable cable guide and the cable bend guide arm are positioned in a fixed spatial relationship to form an "L" shape, and
the cable bend guide arm is configured to move in coordination with movement of the moveable cable guide.

9. The cable guide bracket of claim 1, wherein the horizontal portion includes a lip configured to receive the fastener.

10. The cable guide bracket of claim 1, wherein the moveable cable guide is mounted in a slideable relationship with respect to a rack mounted device.

11. A cable guide bracket comprising:
a cable bend guide arm; and
a moveable cable guide formed by a vertical portion and a horizontal portion, the moveable cable guide configured to guide a cable to the cable bend guide arm,
wherein,
the moveable cable guide includes a fastener to enable the horizontal portion to be slidably mounted to a mounting frame and extend along an interior portion of the mounting frame, and
the fastener extends from a receiver and is configured to be secured to the mounting frame by threading the fastener into the receiver.

12. The cable guide bracket of claim 11, wherein the cable bend guide arm is a plurality of cable bend guide arms.

13. The cable guide bracket of claim 12, wherein the plurality of cable bend guide arms extend parallel to each other.

14. A cable guide bracket comprising:
a cable bend guide arm; and
a moveable cable guide formed by a vertical portion and a horizontal portion, the vertical portion configured to guide a cable to the cable bend guide arm and into or out of an interior portion of a rack frame, the horizontal portion configured to be secured to the interior portion of the rack frame via a fastener and extend along the interior portion of the rack frame,
wherein
the moveable cable guide includes the fastener to enable the cable guide bracket to be slidably mounted to a mounting frame.

15. The cable guide bracket of claim 14,
wherein,
the moveable cable guide and the cable bend guide arm are positioned in a fixed spatial relationship, and
the cable bend guide arm is configured to move in coordination with movement of the moveable cable guide.

16. The cable guide bracket of claim 15, wherein the cable bend guide arm is fixed to the moveable cable guide to form an "L" shape.

17. The cable guide bracket of claim 14, wherein the moveable cable guide is mounted in a slideable relationship with respect to a rack mounted device.

18. The cable guide bracket of claim 14, wherein the horizontal portion includes a lip with a receiver configured to receive the fastener.

19. The cable guide bracket of claim 14, wherein the cable guide bracket is configured to be mounted, via the rack frame, to a rack and adjacent to a rack-mounted device benefiting from cable management by the moveable cable guide.

20. The cable guide bracket of claim 14, wherein the cable bend guide arm is fixed to the moveable cable guide via a plate.

* * * * *